(12) United States Patent
Okumura et al.

(10) Patent No.: US 6,346,915 B1
(45) Date of Patent: Feb. 12, 2002

(54) PLASMA PROCESSING METHOD AND APPARATUS

(75) Inventors: Tomohiro Okumura; Takuya Matsui, both of Osaka-fu (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/631,671

(22) Filed: Aug. 3, 2000

(30) Foreign Application Priority Data

Aug. 6, 1999 (JP) .......................... 11-223927

(51) Int. Cl.[7] .......................... H01Q 1/26; C23C 16/00
(52) U.S. Cl. .................. 343/701; 118/723 AN; 118/723 I
(58) Field of Search .......................... 343/701, 700 MS; 118/723 AN, 723 I

(56) References Cited

U.S. PATENT DOCUMENTS 5,180,436 A * 1/1993 Ueda et al. .................. 118/723
5,525,159 A * 6/1996 Hama et al. .................. 118/723
5,811,022 A * 9/1998 Savas et al. .................. 216/68

FOREIGN PATENT DOCUMENTS

JP          8-83696          3/1996

* cited by examiner

Primary Examiner—Hoanganh Le
(74) Attorney, Agent, or Firm—Wenderoth, Lind & Ponack, L.L.P.

(57) ABSTRACT

A substrate is processed while plasma distribution on the substrate is controlled by a plasma trap made up of a groove-shaped space between a dielectric plate and a dielectric ring provided around the dielectric plate, and a groove-shaped space between an antenna and a conductor ring provided around the antenna.

21 Claims, 7 Drawing Sheets

PLASMA PROCESSING METHOD AND APPARATUS

BACKGROUND OF THE INVENTION

The present invention relates to a plasma processing method such as dry etching, sputtering, and plasma CVD, as well as apparatus therefor, to be used for manufacture of semiconductor or other electron devices and micromachines. More particularly, the present invention relates to plasma processing method and apparatus for use of plasma excited with high-frequency power of VHF or UHF band.

Whereas Japanese Unexamined Patent Publication No. 8-83696 describes that use of high-density plasma is important in order to meet the trend toward microstructures of semiconductors and other electron devices, low electron temperature plasma has recently been receiving attention by virtue of its high electron density and low electron temperature.

In the case where a gas having a high negativity, i.e., a gas that tends to generate negative ions, such as $Cl_2$ and $SF_6$, is formed into plasma, when the electron temperature becomes about 3 eV or lower, larger amounts of negative ions are generated than with higher electron temperatures. Taking advantage of this phenomenon makes it possible to prevent etching configuration abnormalities, so-called notch, which may occur when positive charges are accumulated at the bottom of micro-patterns due to excessive incidence of positive ions. This allows etching of extremely micro-patterns to be achieved with high precision.

Also, in the case where a gas containing carbon and fluorine, such as CxFy or CxHyFz (where x, y, z are natural numbers), which is generally used for etching of insulating films such as silicon oxide, is formed into plasma, when the electron temperature becomes about 3 eV or lower, gas dissociation is suppressed more than with higher electron temperatures, where, in particular, generation of F atoms, F radicals and the like is suppressed. Because F atoms, F radicals, and the like are higher in the rate of silicon etching, insulating film etching can be carried out at larger selection ratios to silicon etching the more with lower electron temperatures.

Also, when the electron temperature becomes 3 eV or lower, ion temperature and plasma potential also lower, so that ion damage to the substrate in plasma CVD can be reduced.

It is plasma sources using high-frequency power of VHF or UHF band that are now receiving attention as a technique capable of generating plasma having low electron temperature.

FIG. 9 is a sectional view of a plate antenna type plasma processing apparatus we have already purposed. Referring to FIG. 9, while interior of a vacuum chamber 101 is maintained to a specified pressure by introducing a specified gas from a gas supply device 102 into the vacuum chamber 101 and simultaneously performing exhaustion by a pump 103 as an exhausting device, a high-frequency power of 100 MHz is supplied by an antenna use high-frequency power supply 104 to an antenna 105 via a through hole 107 provided in a dielectric plate 106 which is sandwiched between the antenna 105 and the vacuum chamber 101 and which is generally equal in outer dimensions to the antenna 105. Then, plasma is generated in the vacuum chamber 101, where plasma processing such as etching, deposition, and surface reforming can be carried out on a substrate 109 placed on a substrate electrode 108. In this process, as shown in FIG. 9, by supplying high-frequency power also to the substrate electrode 108 by a substrate-electrode use high-frequency power supply 110, ion energy that reaches the substrate 109 can be controlled. In addition, the surface of the antenna 105 is covered with an insulating cover 111.

Also, a plasma trap 114 formed of a recessed space between the antenna 105 and a conductor ring 113 provided around the antenna 105 is provided. With such a constitution, because electromagnetic waves radiated from the antenna 105 are intensified by the plasma trap 114, and because hollow cathode discharge is liable to occur in plasma at low electron temperatures, it becomes easier to generate high-density plasma (hollow cathode discharge) with the plasma trap 114 surrounded by solid surfaces. Therefore, within the vacuum chamber 101, plasma density becomes the highest at the plasma trap 114, and plasma is transported up to near the substrate 109 by diffusion, by which more uniform plasma can be obtained.

However, there has been an issue that the conventional method shown in FIG. 9 has difficulty in ignitability (start of discharge) at low pressure. It was found that with chlorine gas supplied into the vacuum chamber 101, and with a VHF power of 1000 W applied to the antenna 105, ignition could not be obtained at 0.3 Pa or lower pressures. Also, with the conventional method shown in FIG. 9, ion saturation current density in the vicinity of the substrate 109 is so low that with chlorine gas supplied into the vacuum chamber 110, and with a VHF power of 1000 W applied to the antenna 105, the result was 1.41 $mA/cm^2$ for 1 Pa.

SUMMARY OF THE INVENTION

In view of these issues of the prior art, an object of the present invention is to provide plasma processing method and apparatus superior in ignitability and capable of obtaining high ion saturation current density.

In accomplishing these and other aspects, according to a first aspect of the present invention, there is provided a plasma processing method for generating plasma within a vacuum chamber and processing a substrate placed on a substrate electrode within the vacuum chamber, the method comprising:

supplying a high-frequency power having a frequency of 50 MHz to 3 GHz to an antenna, provided within the vacuum chamber opposite to the substrate, via a through hole provided in a dielectric plate which is sandwiched between the antenna and the vacuum chamber and which is generally equal in outer dimensions to the antenna, while interior of the vacuum chamber is controlled to a specified pressure by introducing a gas into the vacuum chamber and, simultaneously therewith, exhausting the interior of the vacuum chamber, thus generating plasma; and processing the substrate while plasma distribution on the substrate is controlled by a plasma trap made up of a groove-shaped space between the dielectric plate and a dielectric ring provided around the dielectric plate, and a groove-shaped space between the antenna and a conductor ring provided around the antenna.

According to a second aspect of the present invention, there is provided a plasma processing method for generating plasma within a vacuum chamber and processing a substrate placed on a substrate electrode within the vacuum chamber, the method comprising:

supplying a high-frequency power having a frequency of 50 MHz to 3 GHz to an antenna, provided within the vacuum chamber opposite to the substrate, via a through hole provided in a dielectric plate which is sandwiched between the antenna and the vacuum chamber and which is larger in outer dimensions than the antenna, while interior of the vacuum chamber is controlled to a specified pressure by introducing a gas into the vacuum chamber and, simultaneously therewith, exhausting the interior of the vacuum chamber, thus generating plasma; and processing the substrate while plasma distribution on the substrate is controlled by a plasma trap formed of a groove-shaped space between the antenna and a conductor ring provided around the antenna.

According to a third aspect of the present invention, there is provided a plasma processing method for generating plasma within a vacuum chamber and processing a substrate placed on a substrate electrode within the vacuum chamber, the method comprising:

supplying a high-frequency power having a frequency of 50 MHz to 3 GHz to an antenna, provided within the vacuum chamber opposite to the substrate, via a through hole provided in a dielectric plate which is sandwiched between the antenna and the vacuum chamber and which is larger in outer dimensions than the antenna, while interior of the vacuum chamber is controlled to a specified pressure by introducing a gas into the vacuum chamber and, simultaneously therewith, exhausting the interior of the vacuum chamber, thus generating plasma; and processing the substrate while plasma distribution on the substrate is controlled by a plasma trap made up of a groove-shaped space between the antenna and a conductor ring provided around the antenna and a groove-shaped space between the dielectric plate and the conductor ring.

According to a fourth aspect of the present invention, there is provided a plasma processing method according to the first aspect, wherein the substrate is processed while a short pin short-circuits the antenna and the vacuum chamber to each other so as to give an isotropic electromagnetic field distribution to the antenna.

According to a fifth aspect of the present invention, there is provided a plasma processing method according to the first aspect, wherein the substrate is processed while a surface of the antenna is covered with an insulating cover.

According to a sixth aspect of the present invention, there is provided a plasma processing method according to the first aspect, wherein the substrate is processed while the dielectric plate is made up of a plurality of dielectric plates different in material from each other or one another.

According to a seventh aspect of the present invention, there is provided a plasma processing method according to the first aspect, wherein the substrate is processed while no DC magnetic fields are present within the vacuum chamber.

According to an eighth aspect of the present invention, there is provided a plasma processing apparatus comprising:

a vacuum chamber;

a gas supply device for supplying gas into the vacuum chamber;

an exhausting device for exhausting interior of the vacuum chamber;

a substrate electrode for placing thereon a substrate within the vacuum chamber;

an antenna provided opposite to the substrate electrode;

a dielectric plate sandwiched between the antenna and the vacuum chamber and being generally equal in outer dimensions to the antenna; and high-frequency power supply for supplying a high-frequency power having a frequency of 50 MHz to 3 GHz to the antenna via a through hole provided in the dielectric plate, wherein a plasma trap made up of a groove-shaped space between the dielectric plate and a dielectric ring provided around the dielectric plate, and a groove-shaped space between the antenna and a conductor ring provided around the antenna, is provided.

According to a ninth aspect of the present invention, there is provided a plasma processing apparatus comprising:

a vacuum chamber;

a gas supply device for supplying gas into the vacuum chamber;

an exhausting device for exhausting interior of the vacuum chamber;

a substrate electrode for placing thereon a substrate within the vacuum chamber;

an antenna provided opposite to the substrate electrode;

a dielectric plate sandwiched between the antenna and the vacuum chamber and being larger in outer dimensions than the antenna; and high-frequency power supply for supplying a high-frequency power having a frequency of 50 MHz to 3 GHz to the antenna via a through hole provided in the dielectric plate, wherein a plasma trap formed of a groove-shaped space between the antenna and a conductor ring provided around the antenna, is provided.

According to a tenth aspect of the present invention, there is provided a plasma processing apparatus comprising:

a vacuum chamber;

a gas supply device for supplying gas into the vacuum chamber;

an exhausting device for exhausting interior of the vacuum chamber;

a substrate electrode for placing thereon a substrate within the vacuum chamber;

an antenna provided opposite to the substrate electrode;

a dielectric plate sandwiched between the antenna and the vacuum chamber and being larger in outer dimensions than the antenna; and high-frequency power supply for supplying a high-frequency power having a frequency of 50 MHz to 3 GHz to the antenna via a through hole provided in the dielectric plate, wherein a plasma trap made up of a groove-shaped space between the antenna and a conductor ring provided around the antenna and a groove-shaped space between the dielectric plate and the conductor ring, is provided.

According to an 11th aspect of the present invention, there is provided a plasma processing apparatus according to the eighth aspect, further comprising a short pin for short-circuiting the antenna and the vacuum chamber to each other.

According to a 12th aspect of the present invention, there is provided a plasma processing apparatus according to the eighth aspect, wherein a surface of the antenna is covered with an insulating cover.

According to a 13th aspect of the present invention, there is provided a plasma processing apparatus according to the eighth aspect, wherein the dielectric plate is made up of a plurality of dielectric plates different in material from each other or one another.

According to a 14th aspect of the present invention, there is provided a plasma processing apparatus according to the eighth aspect, wherein the vacuum chamber is equipped inside with no coil or permanent magnet for applying a DC magnetic field into the vacuum chamber.

According to a 15th aspect of the present invention, there is provided a plasma processing apparatus according to the eighth aspect, wherein a diameter of the antenna is 50–90% of a diameter of the substrate.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
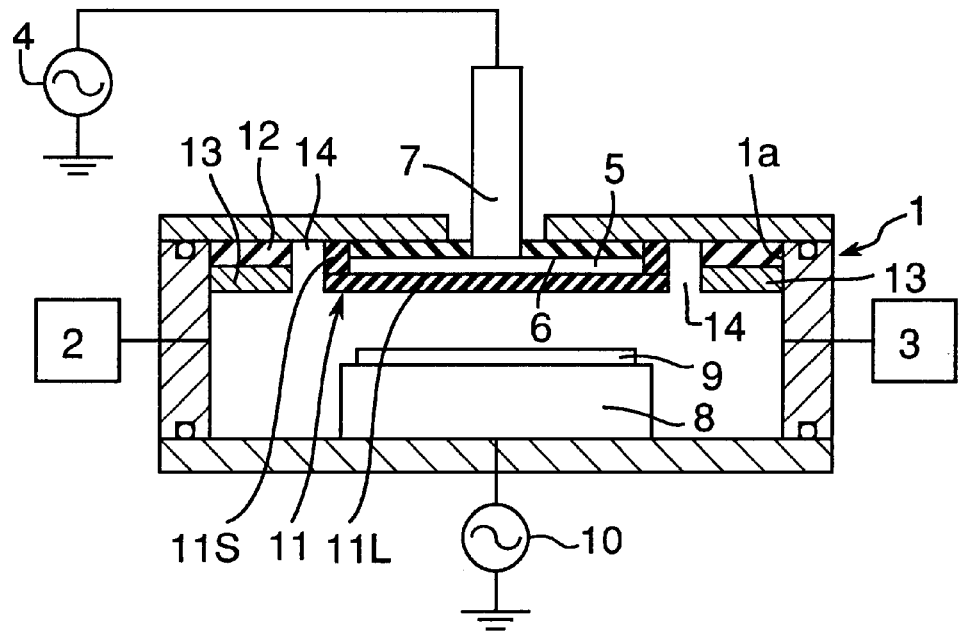
FIG. 1 is a sectional view showing the constitution of a plasma processing apparatus employed in a first embodiment of the present invention.

Before the description of the present invention proceeds, it is to be noted that like parts are designated by like reference numerals throughout the accompanying drawings.

A first embodiment of the present invention is described below with reference to FIG. 1.

FIG. 1 shows a sectional view of a plasma processing apparatus employed in the first embodiment of the present invention. Referring to FIG. 1, while interior of a vacuum chamber 1 is maintained to a specified pressure by introducing a specified gas from a gas supply device 2 into the vacuum chamber 1 and simultaneously performing exhaustion by a pump 3 as an exhausting device, a high-frequency power of 100 MHz is supplied by an antenna use high-frequency power supply 4 to a circular antenna 5 via a through hole 7 provided in a circular dielectric plate 6 which is sandwiched between the antenna 5 and the vacuum chamber 1 and which is generally equal in outer dimensions to the antenna 5. Then, plasma is generated in the vacuum chamber 1, where plasma processing such as etching, deposition, and surface reforming can be carried out on a circular substrate 9 placed on a substrate electrode 8.

During this process, as shown in FIG. 1, by supplying high-frequency power also to the substrate electrode 8 with a substrate-electrode use high-frequency power supply 10, ion energy that reaches the substrate 9 can be controlled. In addition, the surface of the antenna 5 is covered with an insulating cover 11 including a lower cover 11L and a side cover 11S. For example, the dielectric plate 6 is made of ceramic, and the side cover 11S and the lower cover 11L are made of quartz.

Figure 9:
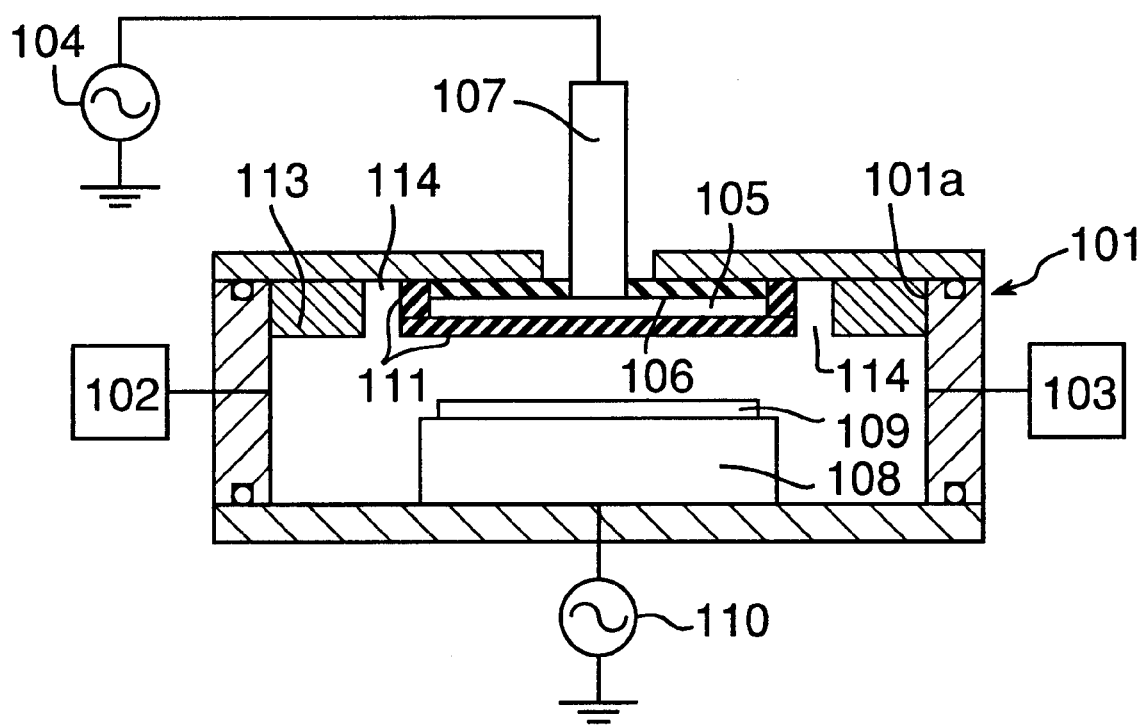
FIG. 9 is a sectional view showing the constitution of a plasma processing apparatus employed in a prior art example.

Further, a ring-shaped plasma trap 14 made up of a groove-shaped space between the dielectric plate 6 and a ring-shaped dielectric ring 12 provided around the dielectric plate 6, and a groove-shaped space between the antenna 5 and a ring-shaped conductor ring 13 provided around the antenna 5, is provided. For example, the dielectric ring 12 is made of quartz and has a thickness of 10 mm which is the same as the thickness of the dielectric plate 6. The width of the plasma trap 14 is 2–15 mm, preferably, 5–10 mm without depending on a size of the substrate, as example. It is preferable that a diameter of the antenna 5 is 50–90% of a diameter of the substrate 9. Each of the conductor ring 13 and each wall of the vacuum chamber 1 is preferably made of metal such as aluminum with its surface covered with alumite. In the prior art example shown in FIG. 9, since electromagnetic waves radiated from the antenna 5 are reflected by the conductor ring 13, electric fields at the plasma trap 14 are relatively small.

On the other hand, in the first embodiment of the present invention shown in FIG. 1, it can be considered that electromagnetic waves radiated from the antenna 5 pass through the plasma trap 14, penetrating into the dielectric ring 12, and are then reflected by a side wall 1a of the vacuum chamber 1, so that the electric fields at the plasma trap 14 become intenser than in the prior art example.

Figure 7:
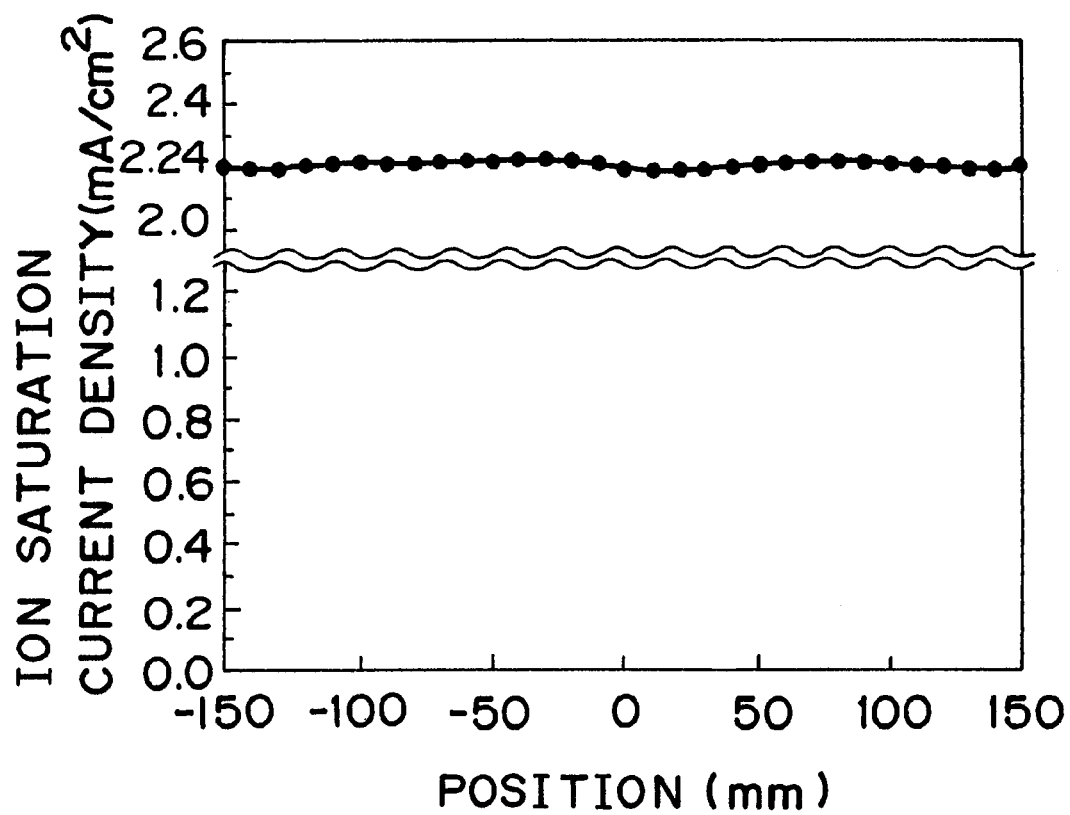
FIG. 7 is a chart showing measuring results of ion saturation current density in the first embodiment of the present invention.
Figure 8:
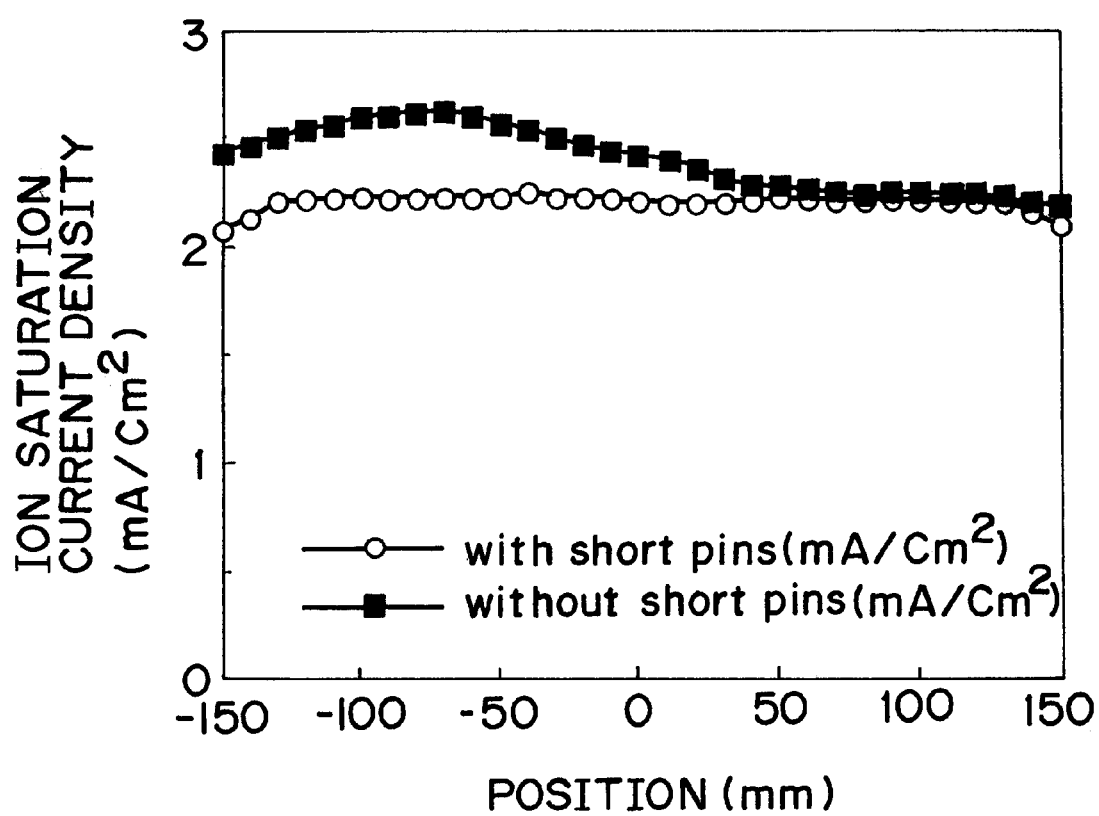
FIG. 8 is a chart showing measuring results of ion saturation current density in a conventional plasma processing apparatus.

In the plasma processing apparatus employed in the first embodiment of the present invention shown in FIG. 1, it is verified that with chlorine gas supplied into the vacuum chamber 1, and with a VHF power of 1000 W applied to the antenna 5, ignition can be obtained even at 0.1 Pa. Also, with chlorine gas supplied into the vacuum chamber 1, and with a VHF power of 1000 W applied to the antenna 5, the ion saturation current density in the vicinity of the substrate 9 is 2.24 mA/cm$^2$ for 1 Pa, showing an improvement as much as about 58% over the prior art example. FIG. 7 shows measuring results of ion saturation current density at a position 20 mm just above the substrate 9 in the plasma processing apparatus of the first embodiment. Conditions for plasma generation are gas type and gas flow rate of $Cl_2$=100 sccm, a pressure of 1.5 Pa and a high-frequency power of 2 kW. It can be understood from FIG. 7 that uniform plasma is generated without such a bias of plasma as seen in FIG. 8.

Ion etching is useful for a lower pressure such as 0.1–0.3 Pa. For example, in etching of an indium or platinum film for FERAM, it is useful that ignition can be obtained at 0.1–0.3 Pa while using Ar—Cl gas.

Figure 10:
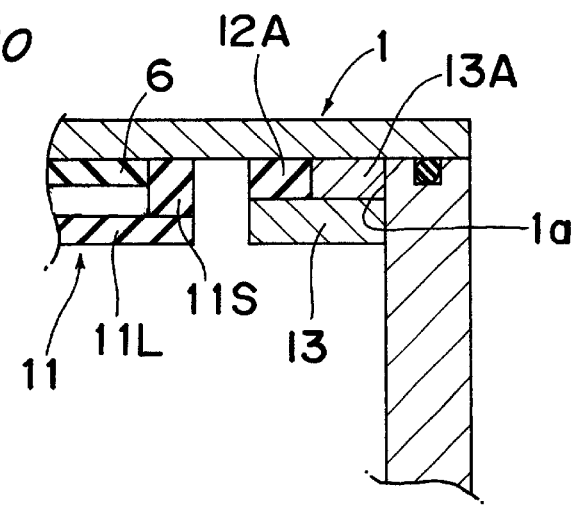
FIG. 10 is a partial enlarged sectional view of a modification of the first embodiment of the present invention.

Although the dielectric ring 12 has the same width as that of the conductor ring 13 as shown in FIG. 1, it is not limited to such a dielectric ring 12, That is, as shown in FIG. 10 as a modification of the first embodiment, the dielectric ring 12A can have the width smaller than that of the conductor ring 13. In FIG. 10, reference numeral 13A denotes an upper conductor ring. That is, the dielectric ring has at least an exposed surface through which the electromagnetic waves radiated from the antenna 5 pass through the plasma trap 14 and, penetrating into the dielectric ring 12 or 12A. The electromagnetic waves which have penetrated into the dielectric ring 12 or 12A through the exposed surface are reflected by the side wall of the vacuum chamber 1 or a side wall of the upper conductor ring 13A.

Next, a second embodiment of the present invention is described with reference to FIG. 2.

Figure 2:
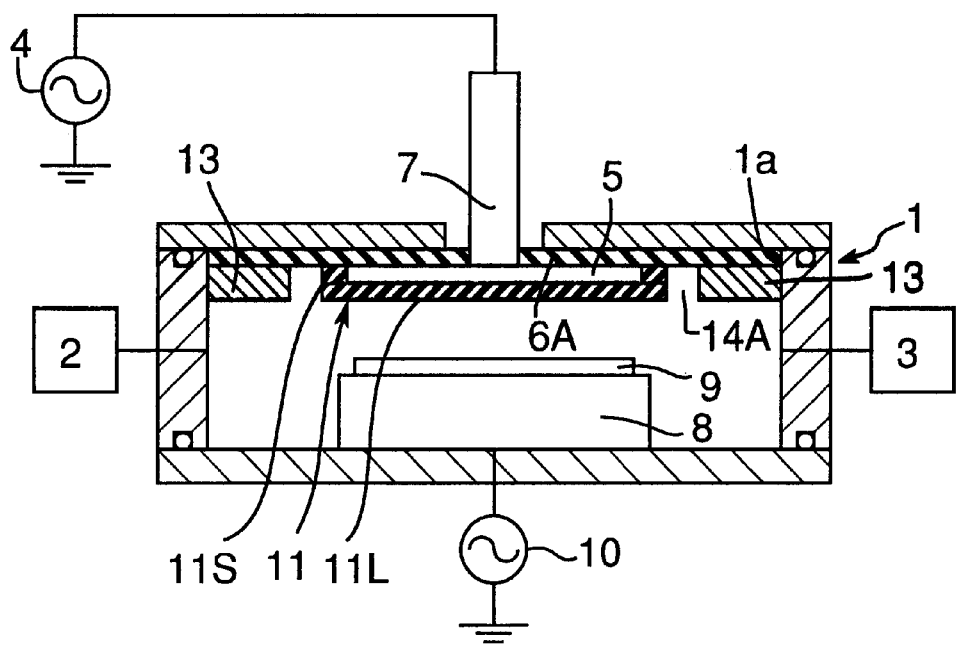
FIG. 2 is a sectional view showing the constitution of a plasma processing apparatus employed in a second embodiment of the present invention.

FIG. 2 shows a sectional view of a plasma processing apparatus employed in the second embodiment of the present invention. Referring to FIG. 2, while interior of the vacuum chamber 1 is maintained to a specified pressure by introducing a specified gas from the gas supply device 2 into the vacuum chamber 1 and simultaneously performing exhaustion by the pump 3 as the exhausting device, a high-frequency power of 100 MHz is supplied by the antenna use high-frequency power supply 4 to the circular antenna 5 via the through hole 7 provided in a circular dielectric plate 6A which is sandwiched between the antenna 5 and the vacuum chamber 1 and which has outer dimensions larger than those of the antenna 5. The side wall of dielectric plate 6A is brought into contact with the side wall 1a of the vacuum chamber 1. Then, plasma is generated in the vacuum chamber 1, where plasma processing such as etching, deposition, and surface reforming can be carried out on the circular substrate 9 placed on the substrate electrode 8. In this process, as shown in FIG. 2, by supplying high-frequency power also to the substrate electrode 8 by the substrate-electrode use high-frequency power supply 10, ion energy that reaches the substrate 9 can be controlled. In addition, the surface of the antenna 5 is covered with the insulating cover 11 which is the same as that of FIG. 1.

Also, a plasma trap 14A formed of a groove-shaped space between the antenna 5 and the ring-shaped conductor ring 13 provided around the antenna 5 is provided. In the second embodiment of the present invention, it can be considered that electromagnetic waves radiated from the antenna 5 expand in the entire dielectric plate 6A and are then reflected by the side wall 1a of the vacuum chamber 1, so that the electric fields at the plasma trap 14 become intenser than in the prior art example. The structure of the second embodiment can be simplified, easily manufactured, and be cheaper as compared with the first embodiment.

In the plasma processing apparatus employed in the second embodiment of the present invention shown in FIG. 2, it is verified that with chlorine gas supplied into the vacuum chamber 1, and with a VHF power of 1000 W applied to the antenna 5, ignition can be obtained even at 0.1 Pa. Also, with chlorine gas supplied into the vacuum chamber 1, and with a VHF power of 1000 W applied to the antenna 5, the ion saturation current density in the vicinity of the substrate 9 is 1.95 mA/cm$^2$ for 1 Pa, showing an improvement as much as about 38% over the prior art example.

Next, a third embodiment of the present invention is described with reference to FIG. 3.

Figure 3:
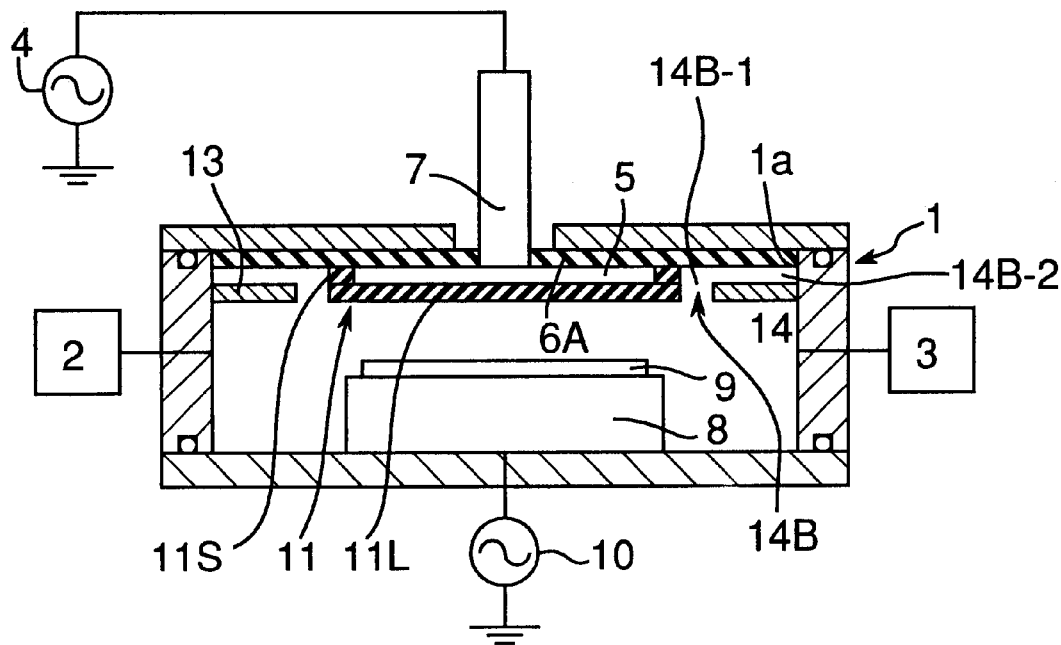
FIG. 3 is a sectional view showing the constitution of a plasma processing apparatus employed in a third embodiment of the present invention.

FIG. 3 shows a sectional view of a plasma processing apparatus employed in the third embodiment of the present invention. Referring to FIG. 3, while interior of the vacuum chamber 1 is maintained to a specified pressure by introducing a specified gas from the gas supply device 2 into the vacuum chamber 1 and simultaneously performing exhaustion by the pump 3 as an exhausting device, a high-frequency power of 100 MHz is supplied by an antenna use high-frequency power supply 4 to the circular antenna 5 via the through hole 7 provided in the circular dielectric plate 6A which is sandwiched between the antenna 5 and the vacuum chamber 1 and which has outer dimensions larger than those of the antenna 5. The side wall of dielectric plate 6A is brought into contact with the side wall 1a of the vacuum chamber 1. Then, plasma is generated in the vacuum chamber 1, where plasma processing such as etching, deposition, and surface reforming can be carried out on the circular substrate 9 placed on the substrate electrode 8. In this process, as shown in FIG. 3, by supplying high-frequency power also to the substrate electrode 8 by the substrate-electrode use high-frequency power supply 10, ion energy that reaches the substrate 9 can be controlled. In addition, the surface of the antenna 5 is covered with an insulating cover 11 which is the same as that of FIG. 1.

Also, a plasma trap 14B formed of a groove-shaped space 14B-1 between the antenna 5 and the ring-shaped conductor ring 13 provided around the antenna 5, and a groove-shaped space 14B-2 between the dielectric plate 6A and the conductor ring 13, is provided. In the third embodiment of the present invention, it can be considered that electromagnetic waves radiated from the antenna 5 expand in the entire dielectric plate 6A and are then reflected by a side wall 1a of the vacuum chamber 1, so that the electric fields at the plasma trap 14 become intenser than in the prior art example.

In the plasma processing apparatus employed in the third embodiment of the present invention shown in FIG. 3, it is verified that with chlorine gas supplied into the vacuum chamber 1, and with a VHF power of 1000 W applied to the antenna 5, ignition can be obtained even at 0.1 Pa. Also, with chlorine gas supplied into the vacuum chamber 1, and with a VHF power of 1000 W applied to the antenna 5, the ion saturation current density in the vicinity of the substrate 9 is 1.72 mA/cm$^2$ for 1 Pa, showing an improvement as much as about 22% over the prior art example. According to the third embodiment, if the conductor ring 13 is expanded by heat, the dielectric plate 6A is not expanded and thus it can be prevented from breaking the dielectric plate 6A due to a difference between the conductor ring 13 and the dielectric plate 6A in expansion coefficient, because the conductor ring 13 is separated from the dielectric plate 6A.

The foregoing embodiments of the present invention as described above are given only by way of example as part of many variations as to the configuration of the vacuum chamber, the configuration and arrangement of the antenna, the configuration and arrangement of the dielectric, and the like, within the application scope of the present invention. It is needless to say that the present invention may be applied in other various ways besides the examples given above.

Also, the foregoing embodiments of the present invention have been described on a case where a high-frequency power of 100 MHz is supplied to the antenna. However, the frequency is not limited to this and the present invention is effective for plasma processing methods and apparatuses using frequencies of 50 MHz to 3 GHz.

Figure 4:
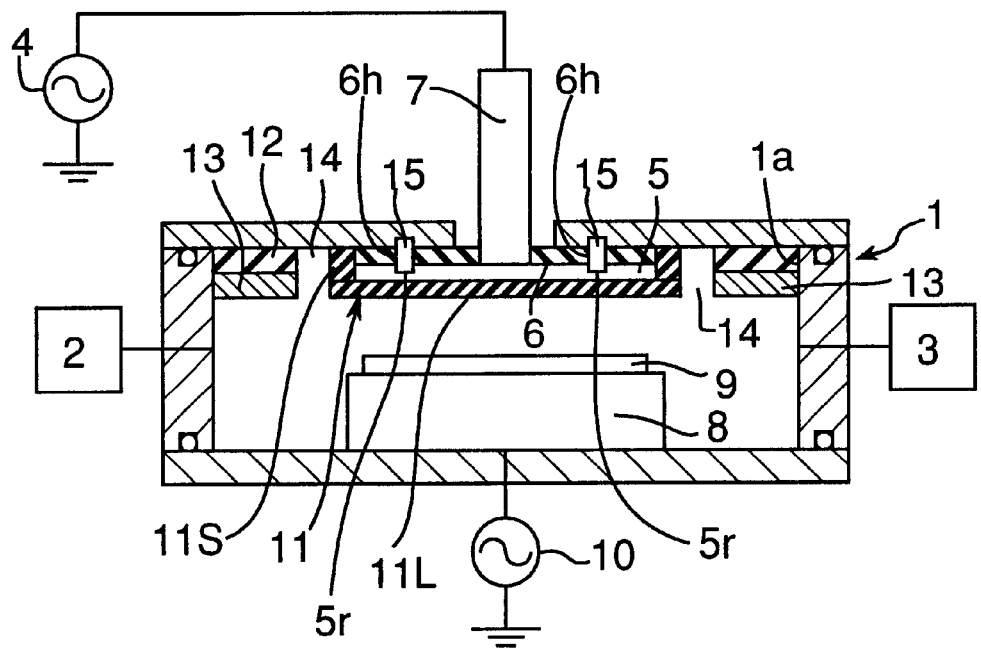
FIG. 4 is a sectional view showing the constitution of a plasma processing apparatus employed in a fourth embodiment of the present invention.
Figure 5:
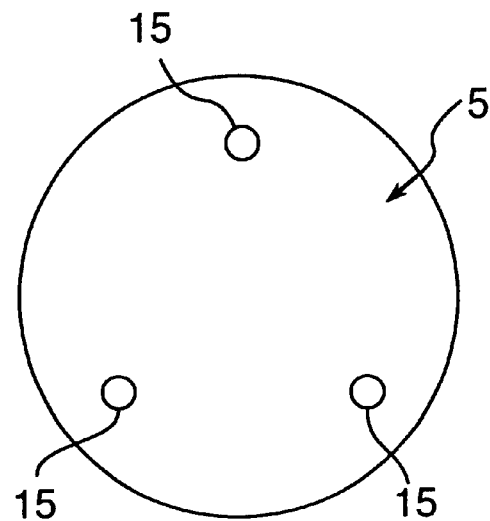
FIG. 5 is a plan view of an antenna employed in the fourth embodiment of the present invention.
Figure 13A:
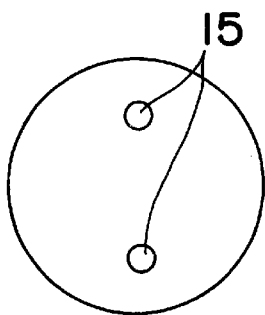
FIGS. 13A, 13B, and 13C are plan views of antennas employed in modifications of the fourth embodiment of the present invention.
Figure 13B:
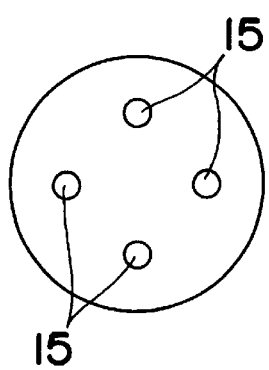
Figure 13C:
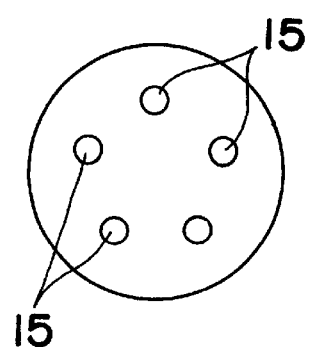

Also, as in a fourth embodiment of the present invention shown in FIG. 4, by grounding the antenna 5 with short pins 15, a more isotropic electromagnetic field distribution can be obtained. As shown in the plan view of the antenna 5 in FIG. 5, the short pins 15 are provided at three sites and arranged equidistantly from one another about the center of the antenna 5 through holes 6h of the dielectric plate 6 to bring into contact with three recesses 5r of the antenna 5. FIGS. 13A, 13B, and 13C are plan views of antennas employed in modifications of the fourth embodiment of the present invention with the two, four, and five short pins 15 arranged equidistantly from one another about the center of each antenna 5. The fourth embodiment can be combined with any one of the other embodiments.

Also, the foregoing embodiments of the present invention have been described on a case where the surface of the antenna is covered with the insulating cover. However, the insulating cover may be omitted. Nevertheless, because of a possibility that without the insulating cover, there may arise issues such as contamination of the substrate due to substances constituting the antenna, it is better that the insulating cover be provided for contamination-sensitive processes. Furthermore, because the ratio of capacitive coupling of the antenna and the plasma increases without the insulating cover so that the plasma density in center portion of the substrate tends to increase, there are some cases, depending on gas type and gas pressure used, where more uniform plasma distribution can be obtained without the insulating cover than with the insulating cover.

Figure 6:
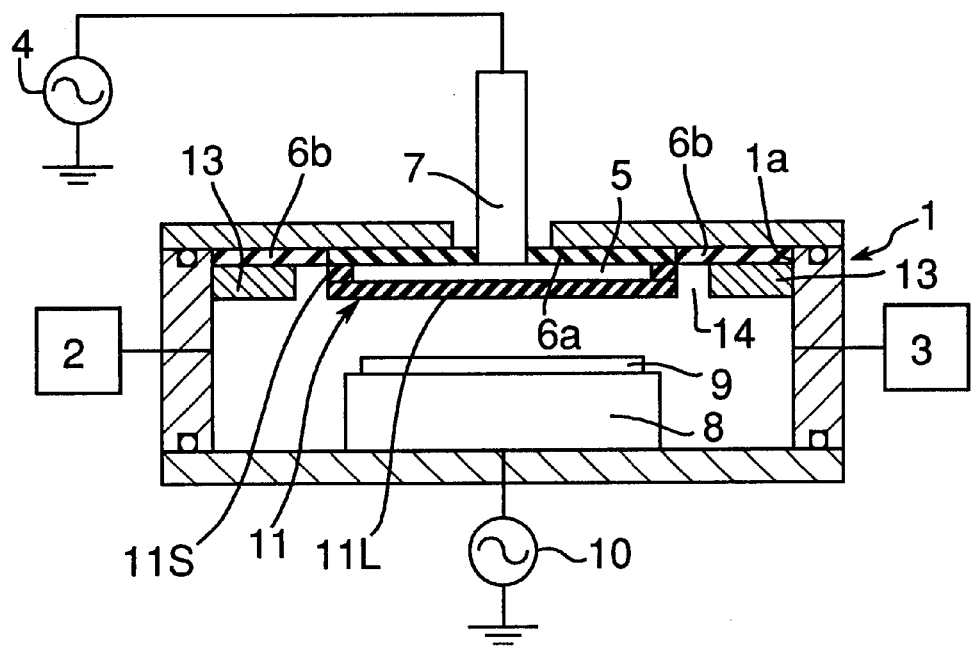
FIG. 6 is a sectional view showing the constitution of a plasma processing apparatus employed in a fifth embodiment of the present invention.

Also, as in a fifth embodiment of the present invention shown in FIG. 6, the dielectric plate 6 may be made up of a plurality of dielectric plates 6a, 6b different in material from each other so that the different dielectric plates 6a, 6b are made of the different materials having different dielectric constants.

Also, the foregoing embodiments of the present invention have been described on a case where no DC magnetic fields are present within the vacuum chamber. However, the present invention is effective also for cases where there is no such a large DC magnetic field as to allow high-frequency power to penetrate into plasma, for example, a case where a small DC magnetic field of several tens of gauss is used for improvement in ignitability. Nonetheless, the present invention is particularly effective for cases where no DC magnetic fields are present in the vacuum chamber.

Figure 11:
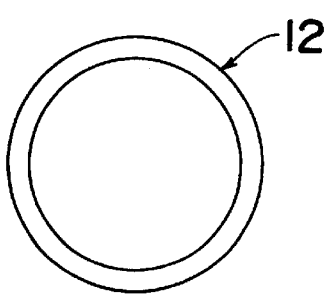
FIG. 11 is a plan view of the conductor ring and/or the dielectric ring of the embodiments.
Figure 12:
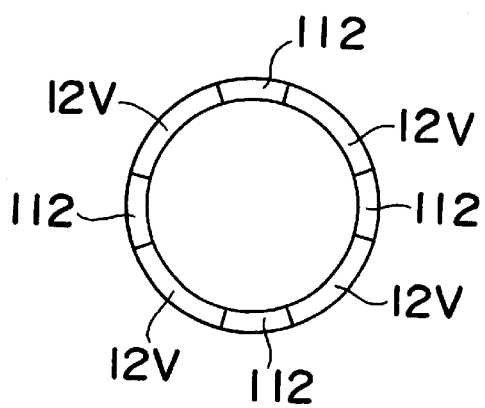
FIG. 12 is a plan view of the conductor ring and/or the dielectric ring of modification of the embodiments.

In the embodiments, although each of the conductor ring 13 and the dielectric ring 12, or the conductor ring 13, has a ring shape as shown in FIG. 11, each of the conductor ring 13 and the dielectric ring 12, or the conductor ring 13, can have a plurality of divided annular parts 12V arranged equidistantly from one another about the center of the antenna 5 with the adjacent divided annular parts 12V arranged via a space 112 as shown in FIG. 12.

As apparent from the above description, according to the present invention, there is provided a plasma processing method for generating plasma within a vacuum chamber and processing a substrate placed on a substrate electrode within the vacuum chamber, the method comprising: supplying a high-frequency power having a frequency of 50 MHz to 3 GHz to an antenna, provided within the vacuum chamber opposite to the substrate, via a through hole provided in a dielectric plate which is sandwiched between the antenna and the vacuum chamber and which is generally equal in outer dimensions to the antenna, while interior of the vacuum chamber is controlled to a specified pressure by introducing a gas into the vacuum chamber and, simultaneously therewith, exhausting the interior of the vacuum chamber, thus generating plasma; and processing the substrate while plasma distribution on the substrate is controlled by a plasma trap made up of a groove-shaped space between the dielectric plate and a dielectric ring provided around the dielectric plate, and a groove-shaped space between the antenna and a conductor ring provided around the antenna. Therefore, this plasma processing method can be superior in ignitability and capable of obtaining high ion saturation current density.

Also, according to a second aspect of the present invention, there is provided a plasma processing method for generating plasma within a vacuum chamber and processing a substrate placed on a substrate electrode within the vacuum chamber, the method comprising: supplying a high-frequency power having a frequency of 50 MHz to 3 GHz to an antenna, provided within the vacuum chamber opposite to the substrate, via a through hole provided in a dielectric plate which is sandwiched between the antenna and the vacuum chamber and which is larger in outer dimensions than the antenna, while interior of the vacuum chamber is controlled to a specified pressure by introducing a gas into the vacuum chamber and, simultaneously therewith, exhausting the interior of the vacuum chamber, thus generating plasma; and processing the substrate while plasma distribution on the substrate is controlled by a plasma trap formed of a groove-shaped space between the antenna and a conductor ring provided around the antenna. Therefore, this plasma processing method can be superior in ignitability and capable of obtaining high ion saturation current density.

Also, according to a third aspect of the invention, there is provided a plasma processing method for generating plasma within a vacuum chamber and processing a substrate placed on a substrate electrode within the vacuum chamber, the method comprising: supplying a high-frequency power having a frequency of 50 MHz to 3 GHz to an antenna, provided within the vacuum chamber opposite to the substrate, via a through hole provided in a dielectric plate which is sandwiched between the antenna and the vacuum chamber and which is larger in outer dimensions than the antenna, while interior of the vacuum chamber is controlled to a specified pressure by introducing a gas into the vacuum chamber and, simultaneously therewith, exhausting the interior of the vacuum chamber, thus generating plasma; and processing the substrate while plasma distribution on the substrate is controlled by a plasma trap made up of a groove-shaped space between the antenna and a conductor ring provided around the antenna and a groove-shaped space between the dielectric plate and the conductor ring. Therefore, this plasma processing method can be superior in ignitability and capable of obtaining high ion saturation current density.

Also, according to a fourth aspect of the present invention, there is provided a plasma processing apparatus comprising: a vacuum chamber; a gas supply device for supplying gas into the vacuum chamber; an exhausting device for exhausting interior of the vacuum chamber; a substrate electrode for placing thereon a substrate within the vacuum chamber; an antenna provided opposite to the substrate electrode; a dielectric plate sandwiched between the antenna and the vacuum chamber and being generally equal in outer dimensions to the antenna; and high-frequency power supply for supplying a high-frequency power having a frequency of 50 MHz to 3 GHz to the antenna via a through hole provided in the dielectric plate, wherein a plasma trap made up of a groove-shaped space between the dielectric plate and a dielectric ring provided around the dielectric plate, and a groove-shaped space between the antenna and a conductor ring provided around the antenna, is provided. Therefore, this plasma processing apparatus can be superior in ignitability and capable of obtaining high ion saturation current density.

Also, according to a fifth aspect of the present invention, there is provided a plasma processing apparatus comprising: a vacuum chamber; a gas supply device for supplying gas into the vacuum chamber; an exhausting device for exhausting interior of the vacuum chamber; a substrate electrode for placing thereon a substrate within the vacuum chamber; an antenna provided opposite to the substrate electrode; a dielectric plate sandwiched between the antenna and the vacuum chamber and being larger in outer dimensions than the antenna; and high-frequency power supply for supplying a high-frequency power having a frequency of 50 MHz to 3 GHz to the antenna via a through hole provided in the dielectric plate, wherein a plasma trap formed of a groove-shaped space between the antenna and a conductor ring provided around the antenna, is provided. Therefore, this plasma processing apparatus can be superior in ignitability and capable of obtaining high ion saturation current density.

Also, according to a sixth aspect of the present invention, there is provided a plasma processing apparatus comprising: a vacuum chamber; a g as supply device for supplying gas into the vacuum chamber; an exhausting device for exhausting interior of the vacuum chamber; a substrate electrode for placing thereon a substrate within the vacuum chamber; an antenna provided opposite to the substrate electrode; a dielectric plate sandwiched between the antenna and the vacuum chamber and being larger in outer dimensions than the antenna; and high-frequency power supply for supplying a high-frequency power having a frequency of 50 MHz to 3 GHz to the antenna via a through hole provided in the dielectric plate, wherein a plasma trap made up of a groove-shaped space between the antenna and a conductor ring provided around the antenna and a groove-shaped space between the dielectric plate and the conductor ring, is provided. Therefore, this plasma processing apparatus can be superior in ignitability and capable of obtaining high ion saturation current density.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing method for generating plasma within a vacuum chamber and processing a substrate placed on a substrate electrode within the vacuum chamber, the method comprising:

supplying a high-frequency power having a frequency of 50 MHz to 3 GHz to an antenna, provided within the vacuum chamber opposite to the substrate, via a through hole provided in a dielectric plate which is sandwiched between the antenna and the vacuum chamber and which is generally equal in outer dimensions to the antenna, while interior of the vacuum chamber is controlled to a specified pressure by introducing a gas into the vacuum chamber and, simultaneously therewith, exhausting the interior of the vacuum chamber, thus generating plasma; and processing the substrate while plasma distribution on the substrate is controlled by a plasma trap made up of a groove-shaped space between the dielectric plate and a dielectric ring provided around the dielectric plate, and a groove-shaped space between the antenna and a conductor ring provided around the antenna.

2. A plasma processing method according to claim 1, wherein the substrate is processed while a short pin short-circuits the antenna and the vacuum chamber to each other so as to give an isotropic electromagnetic field distribution to the antenna.

3. A plasma processing method according to claim 1, wherein the substrate is processed while a surface of the antenna is covered with an insulating cover.

4. A plasma processing method according to claim 1, wherein the substrate is processed while the dielectric plate is made up of a plurality of dielectric plates different in material from each other or one another.

5. A plasma processing method according to claim 1, wherein the substrate is processed while no DC magnetic fields are present within the vacuum chamber.

6. A plasma processing method for generating plasma within a vacuum chamber and processing a substrate placed on a substrate electrode within the vacuum chamber, the method comprising:

supplying a high-frequency power having a frequency of 50 MHz to 3 GHz to an antenna, provided within the vacuum chamber opposite to the substrate, via a through hole provided in a dielectric plate which is sandwiched between the antenna and the vacuum chamber and which is larger in outer dimensions than the antenna, while interior of the vacuum chamber is controlled to a specified pressure by introducing a gas into the vacuum chamber and, simultaneously therewith, exhausting the interior of the vacuum chamber, thus generating plasma; and processing the substrate while plasma distribution on the substrate is controlled by a plasma trap formed of a groove-shaped space between the antenna and a conductor ring provided around the antenna.

7. A plasma processing method for generating plasma within a vacuum chamber and processing a substrate placed on a substrate electrode within the vacuum chamber, the method comprising:

supplying a high-frequency power having a frequency of 50 MHz to 3 GHz to an antenna, provided within the vacuum chamber opposite to the substrate, via a through hole provided in a dielectric plate which is sandwiched between the antenna and the vacuum chamber and which is larger in outer dimensions than the antenna, while interior of the vacuum chamber is controlled to a specified pressure by introducing a gas into the vacuum chamber and, simultaneously therewith, exhausting the interior of the vacuum chamber, thus generating plasma; and processing the substrate while plasma distribution on the substrate is controlled by a plasma trap made up of a groove-shaped space between the antenna and a conductor ring provided around the antenna and a groove-shaped space between the dielectric plate and the conductor ring.

8. A plasma processing apparatus comprising:

a vacuum chamber;

a gas supply device for supplying gas into the vacuum chamber;

an exhausting device for exhausting interior of the vacuum chamber;

a substrate electrode for placing thereon a substrate within the vacuum chamber;

an antenna provided opposite to the substrate electrode;

a dielectric plate sandwiched between the antenna and the vacuum chamber and being generally equal in outer dimensions to the antenna; and high-frequency power supply for supplying a high-frequency power having a frequency of 50 MHz to 3 GHz to the antenna via a through hole provided in the dielectric plate, wherein a plasma trap made up of a groove-shaped space between the dielectric plate and a dielectric ring provided around the dielectric plate, and a groove-shaped space between the antenna and a conductor ring provided around the antenna, is provided.

9. A plasma processing apparatus according to claim 8, further comprising a short pin for short-circuiting the antenna and the vacuum chamber to each other.

10. A plasma processing apparatus according to claim 8, wherein a surface of the antenna is covered with an insulating cover.

11. A plasma processing apparatus according to claim 8, wherein the dielectric plate is made up of a plurality of dielectric plates different in material from each other or one another.

12. A plasma processing apparatus according to claim 8, wherein the vacuum chamber is equipped inside with no coil or permanent magnet for applying a DC magnetic field into the vacuum chamber.

13. A plasma processing apparatus according to claim 8, wherein a diameter of the antenna is 50–90% of a diameter of the substrate.

14. A plasma processing apparatus comprising:
a vacuum chamber;
a gas supply device for supplying gas into the vacuum chamber;
an exhausting device for exhausting interior of the vacuum chamber;
a substrate electrode for placing thereon a substrate within the vacuum chamber;
an antenna provided opposite to the substrate electrode;
a dielectric plate sandwiched between the antenna and the vacuum chamber and being larger in outer dimensions than the antenna; and
high-frequency power supply for supplying a high-frequency power having a frequency of 50 MHz to 3 GHz to the antenna via a through hole provided in the dielectric plate,
wherein a plasma trap formed of a groove-shaped space between the antenna and a conductor ring provided around the antenna, is provided.

15. A plasma processing apparatus comprising:
a vacuum chamber;
a gas supply device for supplying gas into the vacuum chamber;
an exhausting device for exhausting interior of the vacuum chamber;
a substrate electrode for placing thereon a substrate within the vacuum chamber;
an antenna provided opposite to the substrate electrode;
a dielectric plate sandwiched between the antenna and the vacuum chamber and being larger in outer dimensions than the antenna; and
high-frequency power supply for supplying a high-frequency power having a frequency of 50 MHz to 3 GHz to the antenna via a through hole provided in the dielectric plate,
wherein a plasma trap made up of a groove-shaped space between the antenna and a conductor ring provided around the antenna and a groove-shaped space between the dielectric plate and the conductor ring, is provided.

16. A plasma processing method for generating plasma within a vacuum chamber and processing a substrate placed on a substrate electrode within the vacuum chamber, the method comprising:
supplying a high-frequency power having a frequency of 50 MHz to 3 GHz to an antenna, provided within the vacuum chamber opposite to the substrate, via a through hole provided in a dielectric plate which is sandwiched between the antenna and the vacuum chamber and which is generally equal in outer dimensions to the antenna, while interior of the vacuum chamber is controlled to a specified pressure by introducing a gas into the vacuum chamber and, simultaneously therewith, exhausting the interior of the vacuum chamber, thus generating plasma; and
processing the substrate while plasma distribution on the substrate is controlled by a plasma trap made up of a space between the dielectric plate and a dielectric ring provided around the dielectric plate, and a space between the antenna and a conductor ring provided around the antenna.

17. A plasma processing method for generating plasma within a vacuum chamber and processing a substrate placed on a substrate electrode within the vacuum chamber, the method comprising:
supplying a high-frequency of 50 MHz to 3 MHz to an antenna, provided within the vacuum chamber opposite to the substrate, via a through hole provided in a dielectric plate which is sandwiched between the antenna and the vacuum chamber and which is larger in outer dimensions than the antenna, while interior of the vacuum chamber is controlled to a specified pressure by introducing a gas into the vacuum chamber and, simultaneously therewith, exhausting the interior of the vacuum chamber, thus generating plasma; and
processing the substrate while plasma distribution on the substrate is controlled by a plasma trap formed of a space between the antenna and a conductor ring provided around the antenna.

18. A plasma processing method for generating plasma within a vacuum chamber and processing a substrate placed on a substrate electrode within the vacuum chamber, the method comprising:
supplying a high-frequency power having a frequency of 50MHz to 3GHz to an antenna, provided within the vacuum chamber opposite to the substrate, via a through hole provided in a dielectric plate which is sandwiched between the antenna and the vacuum chamber and which is larger in outer dimensions than the antenna, while interior of the vacuum chamber is controlled to a specified pressure by introducing a gas into the vacuum chamber and, simultaneously therewith, exhausting the interior of the vacuum chamber, thus generating plasma; and
processing the substrate while plasma distribution on the substrate is controlled by a plasma trap made up of a space between the antenna and a conductor ring provided around the antenna and a space between the dielectric plate and the conductor ring.

19. A plasma processing apparatus comprising:
a vacuum chamber;
a gas supply device for supplying gas into the vacuum chamber;
an exhausting device for exhausting interior of the vacuum chamber;
a substrate electrode for placing thereon a substrate within the vacuum chamber;

an antenna provided opposite to the substrate electrode;

a dielectric plate sandwiched between the antenna and the vacuum chamber and being generally equal in outer dimensions to the antenna; and high-frequency power supply for supplying a high-frequency power having a frequency of 50 MHz to 3 GHz to the antenna via a through hole provided in the dielectric plate, wherein a plasma trap made up of a space between the dielectric plate and a dieletric ring provided around the dielectric plate, and a space between the antenna and a conductor ring provided around the antenna, is provided.

20. A plasma processing apparatus comprising:

a vacuum chamber;

a gas supply device for supplying gas into the vacuum chamber;

an exhausting device for exhausting interior of the vacuum chamber;

a substrate electrode for placing thereon a substrate within the vacuum chamber;

an antenna provided opposite to the substrate electrode;

a dielectric plate sandwiched between the antenna and the vacuum chamber and being larger in outer dimensions than the antenna; and high-frequency power supply for supplying a high-frequency power having a frequency of 50 MHz to 3 GHz to the antenna via a through hole provided in the dielectric plate, wherein a plasma trap formed of a space between the antenna and a conductor ring provided around the antenna, is provided.

21. A plasma processing apparatus comprising:

a vacuum chamber;

a gas supply device for supplying gas into the vacuum chamber;

an exhausting device for exhausting interior of the vacuum chamber;

a substrate electrode for placing thereon a substrate within the vacuum chamber;

an antenna provided opposite to the substrate electrode;

a dielectric plate sandwiched between the antenna and the vacuum chamber and being larger in outer dimensions than the antenna; and high-frequency power supply for supplying a high-frequency power having a frequency of 50 MHz to 3 GHz to the antenna via a through hole provided in the dielectric plate, wherein a plasma trap made up of a space between the antenna and a conductor ring provided around the antenna and a space between the dieletric plate and the conductor ring, is provided.

* * * * *